(12) United States Patent
Chen et al.

(10) Patent No.: US 9,972,734 B2
(45) Date of Patent: May 15, 2018

(54) PHOTOVOLTAIC MODULES COMPRISING LIGHT DIRECTING MEDIUMS AND METHODS OF MAKING THE SAME

(71) Applicant: 3M INNOVATIVE PROPERTIES COMPANY, Saint Paul, MN (US)

(72) Inventors: Daniel T. Chen, Saint Paul, MN (US); Jiaying Ma, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days. days.

(21) Appl. No.: 14/387,613

(22) PCT Filed: Mar. 12, 2013

(86) PCT No.: PCT/US2013/030367
§ 371 (c)(1),
(2) Date: Sep. 24, 2014

(87) PCT Pub. No.: WO2013/148149
PCT Pub. Date: Oct. 3, 2013

(65) Prior Publication Data
US 2015/0155411 A1   Jun. 4, 2015

Related U.S. Application Data

(60) Provisional application No. 61/616,205, filed on Mar. 27, 2012.

(51) Int. Cl.
*H01L 31/054* (2014.01)
*H01L 31/048* (2014.01)
*H01L 31/05* (2014.01)

(52) U.S. Cl.
CPC .......... *H01L 31/054* (2014.12); *H01L 31/048* (2013.01); *H01L 31/0508* (2013.01); *H01L 31/0547* (2014.12); *Y02E 10/52* (2013.01)

(58) Field of Classification Search
CPC .............. H01L 31/048; H01L 31/0508; H01L 31/0512; H01L 31/054
See application file for complete search history.

(56) References Cited

U.S. PATENT DOCUMENTS

| | | | |
|---|---|---|---|
| 4,235,643 A | 11/1980 | Amick | |
| 4,246,042 A | 1/1981 | Knasel | |

(Continued)

FOREIGN PATENT DOCUMENTS

| | | |
|---|---|---|
| CN | 102217090 | 10/2011 |
| CN | 102347375 | 2/2012 |

(Continued)

OTHER PUBLICATIONS

International Search Report for PCT International Application No. PCT/US2013/030367, dated May 14, 2013, 6pgs.

(Continued)

*Primary Examiner* — Devina Pillay
*Assistant Examiner* — Daniel P Malley, Jr.
(74) *Attorney, Agent, or Firm* — Eric D. Levinson

(57) ABSTRACT

The present disclosure generally relates to photovoltaic modules and methods of making photovoltaic modules. One exemplary photovoltaic module includes a plurality of photovoltaic cells including a first photovoltaic cell and a second photovoltaic cell spaced apart from one another to form an area that is free of photovoltaic cells; an electrical connector connecting at least the first and second photovoltaic cells; and a light directing medium positioned on at least a portion of the first photovoltaic cell.

10 Claims, 1 Drawing Sheet

(56) References Cited

U.S. PATENT DOCUMENTS

| | | | |
|---|---|---|---|
| 4,307,150 | A | 12/1981 | Roche |
| 4,576,850 | A | 3/1986 | Martens |
| 4,751,191 | A | 6/1988 | Gonsiorawski |
| 5,074,920 | A | 12/1991 | Gonsiorawski |
| 5,076,857 | A | 12/1991 | Nowlan |
| 5,118,362 | A | 6/1992 | St. Angelo |
| 5,122,902 | A | 6/1992 | Benson |
| 5,178,685 | A | 1/1993 | Borenstein |
| 5,320,684 | A | 6/1994 | Amick |
| 5,413,568 | A | 5/1995 | Roach |
| 5,478,402 | A | 12/1995 | Hanoka |
| 5,554,229 | A | 9/1996 | Vogeli |
| 5,725,909 | A | 3/1998 | Shaw |
| 5,994,641 | A * | 11/1999 | Kardauskas .......... H01L 31/048 136/246 |
| RE36,754 | E | 6/2000 | Noel |
| 6,203,898 | B1 | 3/2001 | Kohler |
| 6,231,939 | B1 | 5/2001 | Shaw |
| 6,280,063 | B1 | 8/2001 | Fong |
| 6,348,237 | B2 | 2/2002 | Kohler |
| 6,657,009 | B2 | 12/2003 | Zhou |
| 6,660,930 | B1 | 12/2003 | Gonsiorawski |
| 6,758,992 | B2 | 7/2004 | Solomon |
| 6,975,067 | B2 | 12/2005 | McCormick |
| 7,018,713 | B2 | 3/2006 | Padiyath |
| 7,186,465 | B2 | 3/2007 | Bright |
| 7,238,878 | B2 | 7/2007 | Gonsiorawski |
| 7,276,291 | B2 | 10/2007 | Bright |
| 7,467,873 | B2 | 12/2008 | Clarke |
| 8,443,704 | B2 | 5/2013 | Burke |
| 2003/0035231 | A1 | 2/2003 | Epstein |
| 2004/0187911 | A1 | 9/2004 | Gaudiana |
| 2004/0241454 | A1 | 12/2004 | Shaw |
| 2006/0107991 | A1 | 5/2006 | Baba |
| 2007/0020451 | A1 | 1/2007 | Padiyath |
| 2007/0125415 | A1 | 6/2007 | Sachs |
| 2007/0138044 | A1 | 6/2007 | Trotter |
| 2007/0147712 | A1 | 6/2007 | Ozdeger |
| 2008/0078445 | A1 | 4/2008 | Patel |
| 2008/0291541 | A1 | 11/2008 | Padiyath |
| 2009/0038450 | A1 | 2/2009 | Campbell |
| 2009/0066935 | A1 | 3/2009 | Fujimoto |
| 2009/0178704 | A1* | 7/2009 | Kalejs ............... B32B 17/10743 136/246 |
| 2009/0194148 | A1* | 8/2009 | Taguchi ............. H01L 31/0232 136/251 |
| 2009/0314329 | A1 | 12/2009 | Saha |
| 2009/0320908 | A1 | 12/2009 | Botkin |
| 2010/0000595 | A1* | 1/2010 | Haga .................. H01L 31/0504 136/246 |
| 2010/0180946 | A1 | 7/2010 | Gruhlke |
| 2010/0186570 | A1 | 7/2010 | Ehnes |
| 2010/0200046 | A1 | 8/2010 | Sauar |
| 2010/0307565 | A1 | 12/2010 | Suga |
| 2010/0330726 | A1 | 12/2010 | Gonsiorawski |
| 2011/0186114 | A1 | 8/2011 | Homma |
| 2011/0220195 | A1 | 9/2011 | Moronaga |
| 2011/0240095 | A1 | 10/2011 | Murillo-Mora |
| 2012/0012181 | A1 | 1/2012 | Suga |
| 2012/0060895 | A1 | 3/2012 | Rubin |
| 2012/0192918 | A1 | 8/2012 | Zhou |
| 2013/0038928 | A1 | 2/2013 | Padiyath |
| 2013/0236697 | A1 | 9/2013 | Walker, Jr. |
| 2014/0116495 | A1 | 5/2014 | Kim |
| 2014/0119033 | A1 | 5/2014 | Vasylyev |
| 2014/0198390 | A1 | 7/2014 | Padiyath |
| 2014/0268758 | A1 | 9/2014 | Morgan |
| 2014/0293436 | A1 | 10/2014 | Nagahama |
| 2015/0155411 | A1 | 6/2015 | Chen |
| 2016/0172518 | A1 | 6/2016 | Ma |

FOREIGN PATENT DOCUMENTS

| | | |
|---|---|---|
| EP | 2141747 | 1/2010 |
| JP | 11-307791 | 11/1999 |
| JP | 2005-243972 | 9/2005 |
| JP | 2010-016247 | 1/2010 |
| JP | 2010-087060 | 4/2010 |
| JP | 2010-147454 | 7/2010 |
| JP | 2011-108725 | 6/2011 |
| WO | WO 2007/047745 | 4/2007 |
| WO | WO 2012/082391 | 6/2012 |
| WO | WO 2013/027423 | 2/2013 |
| WO | 2013-066459 | 5/2013 |
| WO | 2013-066460 | 5/2013 |
| WO | WO 2013/080618 | 6/2013 |
| WO | WO 2013/148149 | 10/2013 |
| WO | WO 2015/006063 | 1/2015 |
| WO | WO 2015/006097 | 1/2015 |
| WO | WO 2015/050862 | 4/2015 |
| WO | WO 2015/095189 | 6/2015 |
| WO | WO 2016/168164 | 10/2016 |
| WO | WO 2017/066146 | 4/2017 |

OTHER PUBLICATIONS

Supplemental European Search Report for EP 13 76 9124 dated Nov. 3, 2015.
International Preliminary Report on Patentability for PCT/US2016/027066 dated Aug. 17, 2017.
International Search Report for PCT/US2014/044344 dated Oct. 6, 2014.
International Search Report for PCT/US2014/045029 dated Oct. 6, 2014.
International Search Report for PCT/US2016/027066 dated Jul. 5, 2016.
International Search Report for PCT/US2016/056339 dated Dec. 22, 2016.
International Search Report for PCT/US2017/040505 dated Sep. 15, 2017.
Smith, W. J. 1966. Modern Optic Engineering. pp. 104-105. McGraw-Hill.
Written Opinion of the International Search Authority for PCT/US16/56339 dated Dec. 22, 2016.

* cited by examiner

PHOTOVOLTAIC MODULES COMPRISING LIGHT DIRECTING MEDIUMS AND METHODS OF MAKING THE SAME

CROSS REFERENCE TO RELATED APPLICATIONS

This application is a national stage filing under 35 U.S.C. 371 of International Application No. PCT/US2013/030367, filed 12 Mar. 2013, which claims priority to U.S. Provisional Application No. 61/616,205, filed 27 Mar. 2012. The disclosures of both applications are incorporated by reference in their entirety herein.

BACKGROUND

Renewable energy is energy derived from natural resources that can be replenished, such as sunlight, wind, rain, tides, and geothermal heat. The demand for renewable energy has grown substantially with advances in technology and increases in global population. Although fossil fuels provide for the vast majority of energy consumption today, these fuels are non-renewable. The global dependence on these fossil fuels has not only raised concerns about their depletion but also environmental concerns associated with emissions that result from burning these fuels. As a result of these concerns, countries worldwide have been establishing initiatives to develop both large-scale and small-scale renewable energy resources. One of the promising energy resources today is sunlight. Globally, millions of households currently obtain power from solar photovoltaic systems. The rising demand for solar power has been accompanied by a rising demand for devices and materials capable of fulfilling the requirements for these applications.

Harnessing sunlight may be accomplished by the use of photovoltaic (PV) cells (solar cells), which are used for photoelectric conversion, e.g., silicon photovoltaic cells. PV cells are relatively small in size and typically combined into a physically integrated PV module (solar module) having a correspondingly greater power output. PV modules are generally formed from 2 or more "strings" of PV cells, with each string consisting of a plurality of cells arranged in a row and electrically connected in series using tinned flat copper wires (also known as electrical connectors, tabbing ribbons or bus wires). These electrical connectors are typically adhered to the PV cells by a soldering process.

PV modules typically comprise a PV cell surrounded by an encapsulant, such as generally described in U.S. Patent Publication No. 2008/0078445 (Patel et al), the disclosure of which is incorporated herein by reference. In some embodiments, the PV module includes encapsulant on both sides of the PV cell. Two panels of glass (or other suitable polymeric material) are positioned adjacent and bonded to the front-side and backside of the encapsulant. The two panels are transparent to solar radiation and are typically referred to as front-side layer and backside layer, or backsheet. The front-side layer and the backsheet may be made of the same or a different material. The encapsulant is a light-transparent polymer material that encapsulates the PV cells and also is bonded to the front-side layer and backsheet so as to physically seal off the cells. This laminated construction provides mechanical support for the cells and also protects them against damage due to environmental factors such as wind, snow, and ice. The PV module is typically fit into a metal frame, with a sealant covering the edges of the module engaged by the metal frame. The metal frame protects the edges of the module, provides additional mechanical strength, and facilitates combining it with other modules so as to form a larger array or solar panel that can be mounted to a suitable support that holds the modules at the proper angle to maximize reception of solar radiation.

The art of making photovoltaic cells and combining them to make laminated modules is exemplified in, for example, the following U.S. Pat. No. 4,751,191 (Gonsiorawski et al.); U.S. Pat. No. 5,074,920 (Gonsiorawski et al.), U.S. Pat. No. 5,118,362 (St. Angelo et al.); U.S. Pat. No. 5,178,685 (Borenstein et al.); U.S. Pat. No. 5,320,684 (Amick et al); and U.S. Pat. No. 5,478,402 (Hanoka). The teachings of those patents are incorporated herein in their entirety.

SUMMARY

Electrical connectors in photovoltaic modules create inactive shaded areas, (i.e., areas in which incident light onto is not absorbed for photovoltaic or photoelectric conversion). The total surface active area (i.e., the total area in which incident light is used for photovoltaic or photoelectric conversion) is less than 100% due to the presence of these inactive shaded areas. Consequently, an increase in the number or width of electrical connectors decreases the amount of current that can be generated by a photovoltaic module because of the increase in inactive shaded area.

The inventors of the present application sought to increase power output of a PV module. In particular, the inventors of the present application sought to develop a PV module including one or more light directing mediums that direct light that would otherwise be incident on an inactive shaded area onto an active area. In this way, the total power output of the PV modules can be increased. In some embodiments, the inventors of the present application position the light directing medium to direct light that would have been incident on the electrical connectors into active areas of the PV module. In some embodiments, this involved placement of the light directing medium adjacent to the electrical connectors. The presence of the light redirecting medium increases the total active surface area of the array of photovoltaic cells in comparison to a PV module without light redirecting medium(s). In addition, the present inventors sought to develop methods of making these PV modules.

Some embodiments are directed to a photovoltaic module, comprising: a plurality of photovoltaic cells including a first photovoltaic cell and a second photovoltaic cell spaced apart from one another to form an area that is free of photovoltaic cells; an electrical connector connecting at least the first and second photovoltaic cells; and a light directing medium positioned on at least a portion of the first photovoltaic cell. In some embodiments, the light redirecting medium is also positioned on or adjacent to the second photovoltaic cell and extends through at least a portion of the area free of photovoltaic cells.

Some embodiments are directed to a method of making a photovoltaic module including a plurality of photovoltaic cells including a first photovoltaic cell and a second photovoltaic cell that are spaced apart from one another to form an area free of photovoltaic cells, comprising: positioning a light directing medium adjacent to at least a portion of the first photovoltaic cell. In some embodiments, the light redirecting medium is also positioned on or adjacent to the second photovoltaic cell and extends through at least a portion of the area free of photovoltaic cells.

Some embodiments are directed to a method of making a photovoltaic module, comprising: forming a plurality of photovoltaic cells on a planar surface; the plurality of photovoltaic cells being spaced apart from one another in an array of rows and columns; a plurality of areas free of photovoltaic cells between adjacent rows and columns; positioning an electrical connector on at least a portion of a first photovoltaic cell; applying an adhesive composition onto the electrical connector; and positioning a light directing medium adjacent to the adhesive composition such that light incident on the portion of the photovoltaic module including the electrical connector is incident on the light directing medium instead of the electrical connector. In some embodiments, the light redirecting medium is also positioned on or adjacent to the second photovoltaic cell and extends through at least a portion of the area free of photovoltaic cells. Some embodiments further comprise the step of: heating the photovoltaic module to melt the adhesive and effectively adhere the light directing medium to the electrical connector.

In some embodiments, the light directing medium is directly adjacent to and/or adhered to the electrical connector. In some embodiments, the light directing medium is adhered to the electrical connector by means of an adhesive. In some embodiments, the adhesive is one of a hot-melt adhesive and/or a pressure-sensitive adhesive. In some embodiments, the electrical connector is a coated copper wire. In some embodiments, the light directing medium is a flexible polymeric film that directs incident light onto an optically active area of at least one of the photovoltaic cells in the plurality of photovoltaic cells. In some embodiments, the flexible polymeric film is provided in the form of continuous strip. In some embodiments, the light directing medium comprises a generally flat major surface opposite a structured major surface. In some embodiments, the photovoltaic module further includes a reflective coating. In some embodiments, the light directing medium is a multilayer construction comprising: a generally planar flexible polymeric layer; and a structured layer. In some embodiments, the photovoltaic module further includes a reflective coating. In some embodiments, light incident on the portion of the photovoltaic module including the electrical connector is incident on the light directing medium instead of the electrical connector.

Other features and advantages of the present application are described or set forth in the following detailed specification that is to be considered together with the accompanying four drawings.

BRIEF DESCRIPTION OF DRAWINGS

The present disclosure may be more completely understood in consideration of the following detailed description of various embodiments of the disclosure in connection with the accompanying drawings.

The figures are not necessarily to scale. It will be understood that the use of a number to refer to a component in a given figure is not intended to limit the component in another figure labeled with the same number.

DETAILED DESCRIPTION

In the following detailed description, reference may be made to the accompanying set of drawings that form a part hereof and in which are shown by way of illustration several specific embodiments. It is to be understood that other embodiments are contemplated and may be made without departing from the scope or spirit of the present disclosure.

Figure 1:
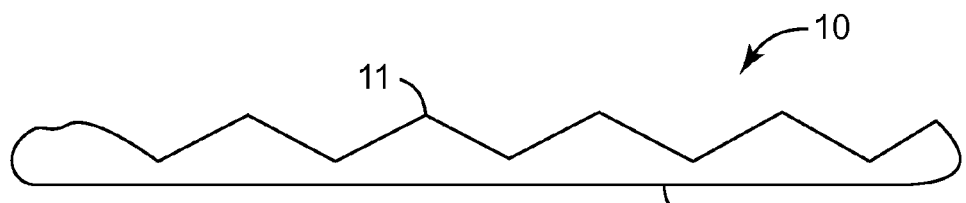
FIG. 1 is a schematic representation of a monolithic light directing medium of the prior art.

A prior art monolithic patterned electrical connector 10 comprising a structured major surface 11 and a generally flat opposite major surface 12 has been described, for example, in U.S. Patent Publication No. 2007/0125415 (Sachs), and is shown in FIG. 1. The structured surface 11 behaves as a light directing medium, reflecting light back to the photovoltaic cell. One disadvantage associated with this type of construction relates to the soldering process used to attach the electrical connectors to the photovoltaic cells. When the solder contacts the structured surface 11 of the monolithic electrical connector 10, it destroys at least part of the structure, thereby creating inactive areas.

Another disadvantage of a monolithic (i.e., wherein the structured surface is adjacent to and integral with the flat major surface) construction relates to flexibility. In some instances, it is desirable that the flat major surface be flexible and the structured surface be less flexible to provide adequate weathering properties. Also, in some embodiments it is desirable that the flat major surface (which is positioned adjacent to the PV cells) have good adhesion to the PV cells, and therefore may be made of a different material than the structured surface.

The present inventors sought, for example, to develop a PV module that overcomes the above identified deficiencies. The present inventors also sought, for example, to develop a PV module that has at least one of increased efficiency, increased energy generation, and increased active area. The PV modules of the present application include electrical connectors and light directing mediums which are not damaged by the soldering process. The present inventors also sought to develop methods of making these PV modules.

Figure 2:
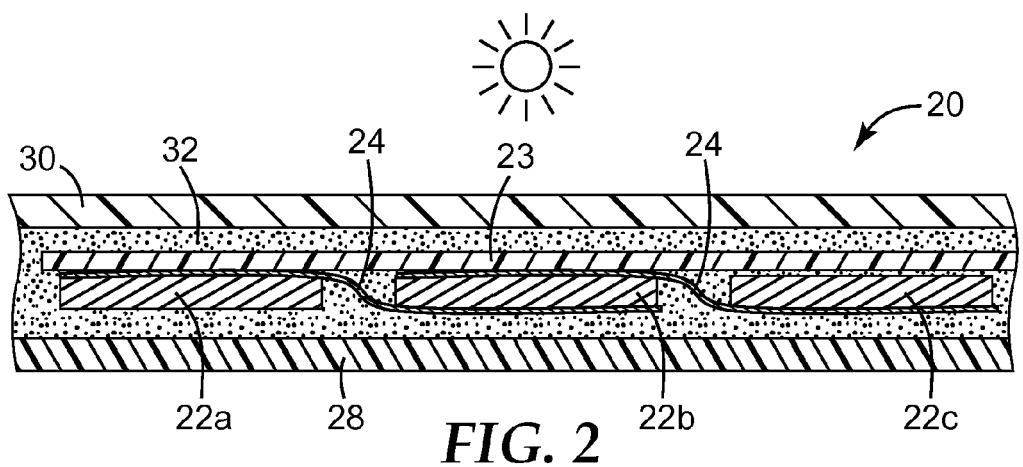
FIG. 2 is a lengthwise cross-sectional view of one embodiment of a PV module in accordance with the teachings herein.

FIG. 2 is a cross-sectional view of one exemplary embodiment of a PV module according to the present application. PV module 20 comprises a plurality of rectangular PV cells 22a, 22b, 22c. Any PV cell can be used in the PV module of the present application. Some examples of photovoltaic cells include thin film photovoltaic cells (like Copper Indium Gallium di-Selenide (CIGS)), CIS (CuInSe$_2$) cells, a-Si (amorphous silicon) cells, c-Si (crystalline silicon), and organic photovoltaic devices (OPVs). A metallization pattern is applied to the PV cells, most commonly by screen printing of silver inks. This pattern consists of an array of fine parallel gridlines (also known as fingers) (not shown). Exemplary PV cells include those made substantially as illustrated and described in U.S. Pat. No. 4,751,191 (Gonsiorawski et al), U.S. Pat. No. 5,074,920 (Gonsiorawski et al), U.S. Pat. No. 5,118,362 (St. Angelo et al), U.S. Pat. No. 5,320,684 (Amick et al) and U.S. Pat. No. 5,478,402 (Hanoka), each of which is incorporated herein in its entirety. Electrical connectors 24 are disposed over and typically soldered to the PV cells, to collect current from the fingers. In some embodiments, electrical connectors 24 are provided in the form of coated (e.g., tinned) copper wires. Although not shown, it is to be understood that in some embodiments, each PV cell includes a rear contact on its rear surface.

In general, light directing mediums 23 reflect incident sunlight back onto one or more active areas of the PV cells. In some embodiments, light redirecting medium 23 is positioned adjacent to one or more electrical connectors 24 or portions of electrical connectors 24. For example, the light redirecting mediums can be adjacent to the electrical connectors on one or more photovoltaic cells or can be adjacent to the area free of photovoltaic cells as well as to one or more photovoltaic cells.

Exemplary suitable light directing mediums include, for example, those made of a thermoplastic film having a plurality of parallel grooves coated with a light reflecting coating. In some embodiments, light directing mediums 23 are bonded to electrical connectors 24. In some embodiments, they are bonded by means of an adhesive 25. In some embodiments, the adhesive is a thermally-activated (e.g., hot melt adhesive). In some embodiments, the adhesive is a pressure-sensitive adhesive (PSA). In some embodiments, the adhesive is laminated to the light directing mediums prior to adhesion onto electrical connector 24. In some embodiments, the adhesive is applied over electrical connectors 24 prior to application of one or more light directing mediums 23.

PV module 20 also includes a back protector member, often in the form of backsheet 28. In some preferred embodiments, backsheet 28 is an electrically insulating material such as glass, a polymeric layer, a polymeric layer reinforced with reinforcing fibers (e.g., glass, ceramic or polymeric fivers), or a wood particle board. In some embodiments, backsheet 28 includes a type of glass or quartz. In some embodiments, the glass is thermally tempered. Some exemplary glass materials include soda-lime-silica based glass. In other embodiments, backsheet 28 is a polymeric film. Exemplary backsheets include multilayer polymer films. One commercially available example of a backsheet is the 3M™ Scotchshield™ film commercially available from 3M Company, Saint Paul, Minn. Exemplary backsheets are those that include extruded PTFE. The backsheet may be connected to a building material, such as a roofing membrane (for example, in building integrated photovoltaics (BIPV)).

Overlying PV cells 22a, 22b, 22c, is a generally planar light transmitting and electrically non-conducting front-side layer 30, which also provides support to the photovoltaic cells. In some embodiments, front-side layer 30 includes a type of glass or quartz. In some embodiments, the glass is thermally tempered. Some exemplary glass materials include soda-lime-silica based glass. In some embodiments, the front-side layer has a low iron content (e.g., less than about 0.10% total iron, more preferably less than about 0.08, 0.07 or 0.06% total iron) and/or an antireflection coating thereon to optimize light transmission. In other embodiments, the front-side layer is a barrier layer. Some exemplary barrier layers are those described in, for example, U.S. Pat. No. 7,186,465 (Bright), U.S. Pat. No. 7,276,291 (Bright), U.S. Pat. No. 5,725,909 (Shaw et al), U.S. Pat. No. 6,231,939 (Shaw et al), U.S. Pat. No. 6,975,067 (McCormick et al), U.S. Pat. No. 6,203,898 (Kohler et al), U.S. Pat. No. 6,348,237 (Kohler et al), U.S. Pat. No. 7,018,713 (Padiyath et al), and U.S. Publication Nos. 2007/0020451 and 2004/0241454, all of which are incorporated herein by reference in their entirety.

In some embodiments, interposed between backsheet 28, a front-side layer 30, surrounding cells 22a, 22b, 22c, and electrical connectors 24, is an encapsulant 32 which is made of suitable light-transparent, electrically non-conducting material. In one embodiment, encapsulant 32 is an ethylene vinyl acetate copolymer (EVA), or an ionomer. In one exemplary method, the encapsulant 32 is provided in the form of discrete sheets that are positioned below and/or on top of the array of PV cells 22a, 22b, 22c, with those components in turn being sandwiched between the backsheet 28 and the front-side layer 30. Subsequently the laminate construction is heated under vacuum, causing the encapsulant sheets to become liquified enough to flow around and encapsulate the PV cells, while simultaneously filling any voids in the space between the front-side layer and backsheet. Upon cooling, the liquified encapsulant solidifies. In some embodiments, the encapsulant may be additionally cured in situ to form a transparent solid matrix. The encapsulant adheres to the front-side layer 30 and backsheet 28 to form a laminated subassembly.

Any encapsulant can be used in methods and constructions of the present disclosure. Some exemplary encapsulant types include curable thermosets, thermosettable fluoropolymers, and acrylics. Some exemplary encapsulants include ethylene vinyl acetate (EVA), polyvinyl butyral (PVB), polyolefins, thermoplastic urethanes, clear polyvinylchloride, and ionomers. One exemplary commercially available polyolefin encapsulant is PO8500™, sold by 3M Company. Both thermoplastic and thermoset polyolefin encapsulants can be used. In some embodiments, encapsulants of the types generally described in U.S. Patent Application Nos. 61/555,892 and 61/555,912 can be used, the disclosure of each of which is incorporated herein by reference in its entirety. In some embodiments, an encapsulant can be applied over and around the photovoltaic cell and associated circuitry.

As shown in FIG. 2, a first PV cell 22a is electrically connected to a second cell 22b by electrical connector 24. In the specific embodiment shown in FIG. 2, the first and second cells are directly adjacent to one another, but cells that are not directly adjacent fall within the scope of the present application. In the specific embodiment shown in FIG. 2, electrical connector 24 extends across the entire length of and over the first cell 22a, extending beyond the edge of the first cell 22a and bending down and under the second cell 22b. Electrical connector 24 then extends across the entire length of and underneath second cell 22b. Light directing medium 23 is positioned adjacent to the electrical connector 24. In one embodiment, light directing medium 23 is provided in the form of a continuous strip of flexible polymeric film, which is placed over the entire length of the PV module 20. In another embodiment, light directing medium is provided with cell length size.

Figure 3:
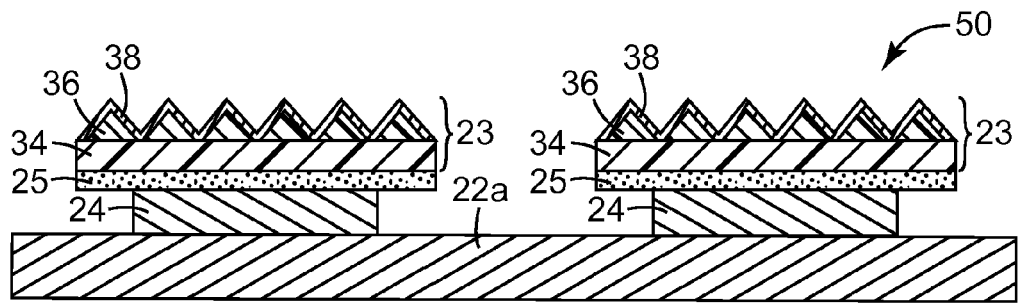
FIG. 3 is a cross-sectional view of one embodiment of a PV cell in accordance with the teachings herein.

FIG. 3 is a cross-sectional view of an exemplary embodiment of a PV module 50 according to the present application. PV module 50 includes multiple electrical connectors 24. In some embodiments, electrical connectors 24 are disposed over the entire length of the PV cell. Light directing medium 23 is disposed over one or more electrical connectors 24. In some embodiments, light directing medium 23 completely overlaps with electrical connector 24 in order to maximize efficiency of the PV module. In an alternative embodiment, light directing medium 23 does not completely overlap electrical connector 24. In some embodiments, light directing mediums are provided in the form of continuous strips which are slightly wider than the electrical connectors. In some embodiments, the width of each electrical connector is about 1.5 mm and the width of each light directing medium is about 1.5 mm. In some embodiments, the width of the light directing medium ranges from about 1.5 mm to about 3.0 mm.

Figure 4:
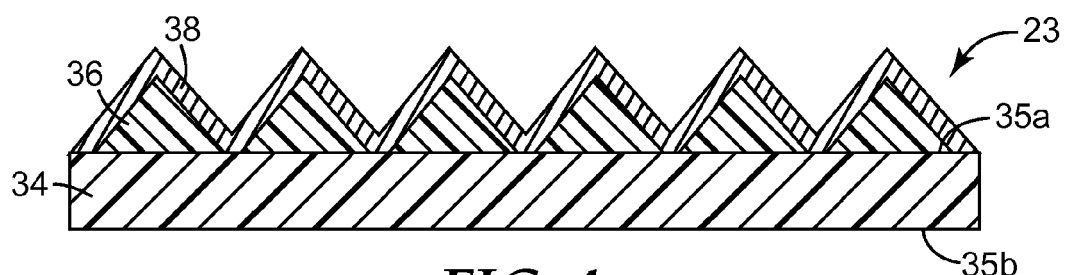
FIG. 4 is a cross-sectional view of one embodiment of a light directing medium in accordance with the teachings herein.

Any light directing medium may be used in the present application including, but not limited to, those described in U.S. Pat. No. 5,994,641 (Kardauskas), U.S. Pat. No. 4,235,643 (Amick), U.S. Pat. No. 5,320,684 (Amick et al), U.S. Pat. No. 4,246,042 (Knasel et al), and U.S. Publication Nos. 2006/0107991 (Baba), and 2010/0200046 (Sauar et al), and 2010/0330726 (Gonsiorawski), the disclosure of each of which is incorporated herein in its entirety. One exemplary light directing medium is a multilayer construction, as shown in FIGS. 3 and 4. Light directing medium 23 comprises a flexible polymeric layer 34 having a first generally flat major surface 35a and a second generally flat major surface 35b. Structured surface 36 is adjacent to the first major surface 35a of the flexible polymeric layer 34. In some embodiments, the flexible polymeric layer 34 is one of a polyolefin (e.g., polyethylene, polypropylene), polyester (e.g., polyethylene terephthalate (PET)), and polyacrylate (e.g., polymethyl(meth)acrylate (PMMA)). In some embodiments, the structured surface 36 is made of one of a thermoplastic polymer and a polymerizable resin. In some embodiments, the structured surface further comprises a reflective coating 38, such as, a metalized layer (e.g., aluminum, silver).

Any desired width of light directing film may be used. In some embodiments, the optimal width of light directing film can be determined based on, for example, at least one of the following factors: the facet design, the index match between the glass and encapsulant, and the thickness of the frontside glass or frontside material. In some embodiments, the light directing medium has a width of between 5 mm and about 30 mm. In some embodiments, the light directing medium has a width of between about 10 mm and about 25 mm. In some embodiments, the light directing medium has a width of between about 12 mm and about 20 mm. In some embodiments, the light directing medium has a width between about 13 mm and about 18 mm.

Polymerizable resins suitable for forming structured surfaces include blends of photoinitiator and at least one compound bearing an acrylate group. Preferably, the resin blend contains a monofunctional, a difunctional, or a polyfunctional compound to ensure formation of a cross-linked polymeric network upon irradiation. Illustrative examples of resins that are capable of being polymerized by a free radical mechanism that can be used herein include acrylic-based resins derived from epoxies, polyesters, polyethers, and urethanes, ethylenically unsaturated compounds, isocyanate derivatives having at least one pendant acrylate group, epoxy resins other than acrylated epoxies, and mixtures and combinations thereof. The term "acrylate" is used herein to encompass both acrylates and methacrylates. U.S. Pat. No. 4,576,850 (Martens) (incorporated herein in its entirety) discloses examples of crosslinked resins that may be used in forming the structured surface of light directing medium 23. In some embodiments, the resin is a non-halogenated resin. Some benefits of use of non-halogenated resins include the fact that they are more environmentally friendly and do not corrode metals.

Some embodiments of the light directing medium include a reflective coating. In some embodiments, the reflective coating is a mirror coating. A reflective coating or a mirror coating have several advantages. For example, these coatings can provide reflectivity of incident sunlight and thus can block incident sunlight from being incident on the polymer materials (which can degrade due to UV exposure). Any desired reflective coating or mirror coating thickness can be used. Some exemplary thicknesses are measured by optical density or percent transmission. Obviously, thicker coatings block more UV light. However, coatings that are too thick may cause increased stress within the coating, resulting in coating cracking. Additionally, thicker coatings are often less durable when exposed to damp heat testing and/or pressure cooker testing. Some light directing mediums have a reflective or mirror coating thickness of between about 35 nm to about 60 nm.

One exemplary method of making PV modules as described herein includes the steps of: providing strings of photovoltaic cells, soldering electrical connectors over the photovoltaic cells, and adhering light directing mediums over the electrical connectors.

During the lamination process of the PV module, it may be important to maintain registration between the electrical connectors and light directing mediums. In one exemplary method of making the PV module of the present application, the light directing mediums are previously laminated with an adhesive. In some embodiments, the adhesive is a hot-melt adhesive. In some embodiments, the hot-melt adhesive is ethylene vinyl acetate polymer (EVA). Other types of suitable hot-melt adhesives include polyolefins. The light directing mediums are positioned over the electrical connectors and heat is applied thereto to melt the hot-melt adhesive, effectively bonding the light directing mediums to the electrical connectors. In some embodiments, other layers may be laminated or coated onto the PV module (e.g., backsheets, encapsulants, front-side layers) prior to the heating step. The heating step may be carried out using any suitable heating mechanism such as, for example, a heat gun or infrared heater. In some embodiments, the heating mechanism is placed under the laminate construction (e.g., adjacent to the backsheet). In some embodiments, the heating mechanism is placed above the laminate construction (e.g., adjacent to the light directing medium).

In some embodiments, the adhesive is a pressure-sensitive adhesive (PSA). Suitable types of PSAs include, but are not limited to, acrylates, silicones, polyisobutylenes, ureas, and combinations thereof. In some embodiments, the PSA is an acrylic or acrylate PSA. As used herein, the term "acrylic" or "acrylate" includes compounds having at least one of acrylic or methacrylic groups. Useful acrylic PSAs can be made, for example, by combining at least two different monomers (first and second monomers). Exemplary suitable first monomers include 2-methylbutyl acrylate, 2-ethylhexyl acrylate, isooctyl acrylate, lauryl acrylate, n-decyl acrylate, 4-methyl-2-pentyl acrylate, isoamyl acrylate, sec-butyl acrylate, and isononyl acrylate. Exemplary suitable second monomers include a (meth)acrylic acid (e.g., acrylic acid, methacrylic acid, itaconic acid, maleic acid, and fumaric acid), a (meth)acrylamide (e.g., acrylamide, methacrylamide, N-ethyl acrylamide, N-hydroxyethyl acrylamide, N-octyl acrylamide, N-t-butyl acrylamide, N,N-dimethyl acrylamide, N,Ndiethyl acrylamide, and N-ethyl-N-dihydroxyethyl acrylamide), a (meth)acrylate (e.g., 2-hydroxyethyl acrylate or methacrylate, cyclohexyl acrylate, t-butyl acrylate, or isobornyl acrylate), N-vinyl pyrrolidone, N-vinyl caprolactam, an alpha-olefin, a vinyl ether, an allyl ether, a styrenic monomer, or a maleate. Acrylic PSAs may also be made by including cross-linking agents in the formulation.

In some embodiments, the adhesive is selectively applied to the electrical connectors, with the width of the light directing mediums being equal to or slightly larger than the width of the electrical connectors. Preferably, the adhesive is transparent. Desired transparency is at least 80% transparency to visible light. In some embodiments, the desired transparency is at least 90% to visible light. In other embodiments, the transparent adhesive is applied over the entire surface of the PV cells (e.g., flood coated). The light directing mediums are then carefully positioned over, and in registration with, the electrical connectors. The entire structure is then heated to melt the adhesive and ensure adequate bonding of the light directing mediums to the electrical connectors.

All references mentioned herein are incorporated by reference.

As used herein, the words "on" and "adjacent" cover both a layer being directly on and indirectly on something, with other layers possibly being located therebetween.

As used herein, the terms "major surface" and "major surfaces" refer to the surface(s) with the largest surface area on a three-dimensional shape having three sets of opposing surfaces.

Unless otherwise indicated, all numbers expressing feature sizes, amounts, and physical properties used in the present disclosure and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this disclosure and the appended claims, the term "or" is generally employed in its sense including "and/or" unless the content clearly dictates otherwise.

Various embodiments and implementation of the present disclosure are disclosed. The disclosed embodiments are presented for purposes of illustration and not limitation. The implementations described above and other implementations are within the scope of the following claims. One skilled in the art will appreciate that the present disclosure can be practiced with embodiments and implementations other than those disclosed. Those having skill in the art will appreciate that many changes may be made to the details of the above-described embodiments and implementations without departing from the underlying principles thereof. It should be understood that this invention is not intended to be unduly limited by the illustrative embodiments and examples set forth herein and that such examples and embodiments are presented by way of example only with the scope of the invention intended to be limited only by the claims set forth herein as follows. Further, various modifications and alterations of the present invention will become apparent to those skilled in the art without departing from the spirit and scope of the present disclosure. The scope of the present application should, therefore, be determined only by the following claims.

The invention claimed is:

1. A photovoltaic module, comprising:
   a plurality of photovoltaic cells including a first photovoltaic cell and a second photovoltaic cell spaced apart from one another to form an area that is free of photovoltaic cells;
   an electrical connector connecting at least the first and second photovoltaic cells;
   a light directing medium positioned on at least a portion of the first photovoltaic cell;
   an encapsulant layer adjacent the photovoltaic cells and the light directing medium; wherein the light directing medium is a multilayer construction comprising, in the recited order:
      an adhesive layer adjacent the electrical connector,
      a generally planar flexible polymeric layer, adjacent the adhesive layer,
      a structured layer, and
      a reflective coating,
      wherein the adhesive layer bonds the light directing medium to the electrical connector,
   wherein the light directing medium and the electrical connector have a length and width in the plane of the multilayer construction, and wherein the width of the light directing medium is greater than the width of the electrical connector.

2. The photovoltaic module of claim 1, wherein the light directing medium is positioned on the at least a portion of the first photovoltaic cell and on at least a portion of the second photovoltaic cell and extends across at least a portion of the area that is free of photovoltaic cells.

3. The photovoltaic module of claim 1, wherein the electrical connector is a coated copper wire.

4. The photovoltaic module of claim 1, wherein the flexible polymeric layer is provided in the form of a continuous strip.

5. The photovoltaic module of claim 1, wherein the structured layer of the light directing medium comprises a cross-linked non-halogenated resin, the reflective coating is metalized, and the structured layer and reflective coating are adjacent to each other.

6. The photovoltaic module of claim 1, wherein the reflective coating thickness ranges from 35 nm to 60 nm.

7. A method of making a photovoltaic module including a plurality of photovoltaic cells including a first photovoltaic cell and a second photovoltaic cell that are spaced apart from one another to form an area free of photovoltaic cells, comprising: positioning a light directing medium adjacent to at least a portion of the first photovoltaic cell; and
   positioning an adhesive layer between an electrical connector and the light directing medium,
   positioning an encapsulant on the photovoltaic cells and the light directing medium, wherein the light directing medium is a multilayer construction comprising, in the recited order:
      a generally planar flexible polymeric layer, adjacent the adhesive layer,
      a structured layer, and
      a reflective coating,
      wherein the adhesive layer bonds the light directing medium to the electrical connector,
   wherein the light directing medium and the electrical connector have a length and width in the plane of the multilayer construction, and wherein the width of the light directing medium is greater than the width of the electrical connector.

8. The method of claim 7, further comprising:
   positioning the light directing medium adjacent to the second photovoltaic cell and extending through at least a portion of the area free of photovoltaic cells.

9. The method of claim 8, further comprising electrically connecting the first photovoltaic cell and the second photovoltaic cell with the electrical connector.

10. The method of claim 7, further comprising the step of: heating the photovoltaic module to melt the adhesive and effectively adhere the light directing medium to the electrical connector.

* * * * *